United States Patent [19]

Choi

[11] Patent Number: 5,940,326

[45] Date of Patent: Aug. 17, 1999

[54] METHOD FOR ERASING DATA STORED IN A NONVOLATILE MEMORY DEVICE

[75] Inventor: Ki-hwan Choi, Seoul, Rep. of Korea

[73] Assignee: Samsung Electronics, Co., Ltd., Suwon, Rep. of Korea

[21] Appl. No.: 09/062,238

[22] Filed: Apr. 17, 1998

[30] Foreign Application Priority Data

Apr. 17, 1997 [KR] Rep. of Korea ............... 97-14271

[51] Int. Cl.$^6$ ............................................. G11C 7/00
[52] U.S. Cl. .................... 365/185.29; 365/185.11; 365/230.03
[58] Field of Search .................. 365/185.29, 185.11, 365/185.2, 230.03, 210

[56] References Cited

U.S. PATENT DOCUMENTS 4,905,191  2/1990  Arai ........................... 365/185.11

Primary Examiner—Vu A. Le
Attorney, Agent, or Firm—Marger Johnson & McCollom, P.C.

[57] ABSTRACT

A method for erasing data stored in a memory having a plurality of memory sectors is disclosed, including the steps of loading at least a dummy address bit and a plurality of address bits, checking whether an address corresponding to a first sector has been latched, and recycling the checking operation against a second sector when the address of the first sector is not latched, and performing an erase operation for a sector assigned to an address latched therein until the erase operation is done for a last sector. The address includes the dummy address bit and the address bits, so that a coding logic can be simplified without identifying with the logic configuration of a programming mode.

3 Claims, 3 Drawing Sheets

Fig. 1

(Prior Art)

|      | A18 | A17 | A16 | A15 | A14 | A13 | A12 |
|------|-----|-----|-----|-----|-----|-----|-----|
| SA0  | 0 | 0 | 0 | 0 | X | X | X |
| SA1  | 0 | 0 | 0 | 1 | X | X | X |
| SA2  | 0 | 0 | 1 | 0 | X | X | X |
| SA3  | 0 | 0 | 1 | 1 | X | X | X |
| SA4  | 0 | 1 | 0 | 0 | X | X | X |
| SA5  | 0 | 1 | 0 | 1 | X | X | X |
| SA6  | 0 | 1 | 1 | 0 | X | X | X |
| SA7  | 0 | 1 | 1 | 1 | X | X | X |
| SA8  | 1 | 0 | 0 | 0 | X | X | X |
| SA9  | 1 | 0 | 0 | 1 | X | X | X |
| SA10 | 1 | 0 | 1 | 0 | X | X | X |
| SA11 | 1 | 0 | 1 | 1 | X | X | X |
| SA12 | 1 | 1 | 0 | 0 | X | X | X |
| SA13 | 1 | 1 | 0 | 1 | X | X | X |
| SA14 | 1 | 1 | 1 | 0 | X | X | X |
| SA15 | 1 | 1 | 1 | 1 | X | X | X |
| SA16 | 1 | 1 | 1 | 1 | 1 | 0 | 0 |
| SA17 | 1 | 1 | 1 | 1 | 1 | 0 | 1 |
| SA18 | 1 | 1 | 1 | 1 | 1 | 1 | X |

Fig. 3

Counting Up →

| | DA19 | A18 | A17 | A16 | A15 | A14 | A13 | A12 |
|---|---|---|---|---|---|---|---|---|
| SA0 | 0 | 0 | 0 | 0 | 0 | X | X | X |
| SA1 | 0 | 0 | 0 | 0 | 1 | X | X | X |
| SA2 | 0 | 0 | 0 | 1 | 0 | X | X | X |
| SA3 | 0 | 0 | 0 | 1 | 1 | X | X | X |
| SA4 | 0 | 0 | 1 | 0 | 0 | X | X | X |
| SA5 | 0 | 0 | 1 | 0 | 1 | X | X | X |
| SA6 | 0 | 0 | 1 | 1 | 0 | X | X | X |
| SA7 | 0 | 0 | 1 | 1 | 1 | X | X | X |
| SA8 | 0 | 1 | 0 | 0 | 0 | X | X | X |
| SA9 | 0 | 1 | 0 | 0 | 1 | X | X | X |
| SA10 | 0 | 1 | 0 | 1 | 0 | X | X | X |
| SA11 | 0 | 1 | 0 | 1 | 1 | X | X | X |
| SA12 | 0 | 1 | 1 | 0 | 0 | X | X | X |
| SA13 | 0 | 1 | 1 | 0 | 1 | X | X | X |
| SA14 | 0 | 1 | 1 | 1 | 0 | X | X | X |
| SA15 | 0 | 1 | 1 | 1 | 1 | X | X | X |
| SA16 | 1 | 0 | 0 | 0 | 0 | X | X | X |
| SA17 | 1 | 0 | 0 | 0 | 1 | X | X | X |
| SA18 | 1 | 0 | 0 | 1 | 0 | X | X | X |

METHOD FOR ERASING DATA STORED IN A NONVOLATILE MEMORY DEVICE

FIELD OF THE INVENTION

The invention relates to a nonvolatile memory device performing programming and erasing operations with address signals externally applied thereto, and more specifically to a method for erasing data stored in the memory during an erase operation.

BACKGROUND OF THE INVENTION

A typical semiconductor memory has a memory cell array divided into a plurality of sectors, so that there is no need of spontaneously reading all of data stored in memory cells assigned to each of word lines, reducing data accessing time. Transferring data in the unit of a sector makes the speed of data processing be enhanced and too causes load capacitance on bit lines and word lines to be reduced thereby. Therefore, a sector-divided nonvolatile memory is capable of programming and erasing more one sectors in response to external address signals. In a erase operation, external addresses involved in sectors to be erased are latched and then the sectors selected by the latched addresses are put into an erase mode in which sequential erasing operations sector by sector are conducted till all of the selected sectors have erased data. The addresses used in the sector erase operation internally are counted up from the external address.

The chart of FIG. 1 shows coding forms of addresses used for programming and erasing operations in a nonvolatile memory composed of 19 sectors. In order to select the 19 sectors, in addition to address signals of four bits for 16 sectors SA0~SA15, further three bits of address signals should be applied thereto for the rest of the sectors, SA16~SA18. As shown in FIG. 1, address signals A15~A18 are spent for selecting sectors SA0~SA15 and address signals A12~A14 for SA16~SA18. Address buffers having flip-flop circuits to select the sectors are in need of comprising additional flip-flop circuits for generating the additional sectors. However, an erase operation substantially does not need the address signals A12~A14 those are additionally provided for a programming operation. Since there is the same coding capacity between the programming and erasing, unnecessary logic components are consumed even in the erasing operation. Such coding capacity of the same would not cause the aforementioned problem when the number of sectors to be selected is just $2^n$ for n-bit address signals, not being over the $2^n$.

SUMMARY OF THE INVENTION

Accordingly, it is a primary object of the invention to provide a method for erasing with a optimized coding capacity without consuming unnecessary logic means.

To achieve the object, the method employs a dummy address for making it possible to complete the address coding in the erase operation for all of the sectors even when the number of the sectors is larger than $2^n$ for n-bit address signals.

Specifically, the method includes the steps of loading at least a dummy address bit and a plurality of address bits, checking whether an address corresponding to a first sector has been latched, and recycling the checking operation against a second sector when the address of the first sector is not latched, and performing an erase operation for a sector assigned to an address latched therein until the erase operation is done for a last sector. The address includes the dummy address bit and the address bits.

BRIEF DESCRIPTION OF THE DRAWINGS

For a better understanding of the invention, and to show how embodiments of the same may be carried effect, reference will now be made, by way of example, to the accompanying diagrammatic drawings, in which:

FIG. 1 is a chart of conventional coding forms with address signals while programming and erasing;

FIG. 3 is a chart of proposed coding forms with address signals during an erase operation.

In the figures, like reference numerals denote like or corresponding parts.

DETAILED DESCRIPTION OF THE PREFERRED EMBODIMENT

Figure 2:
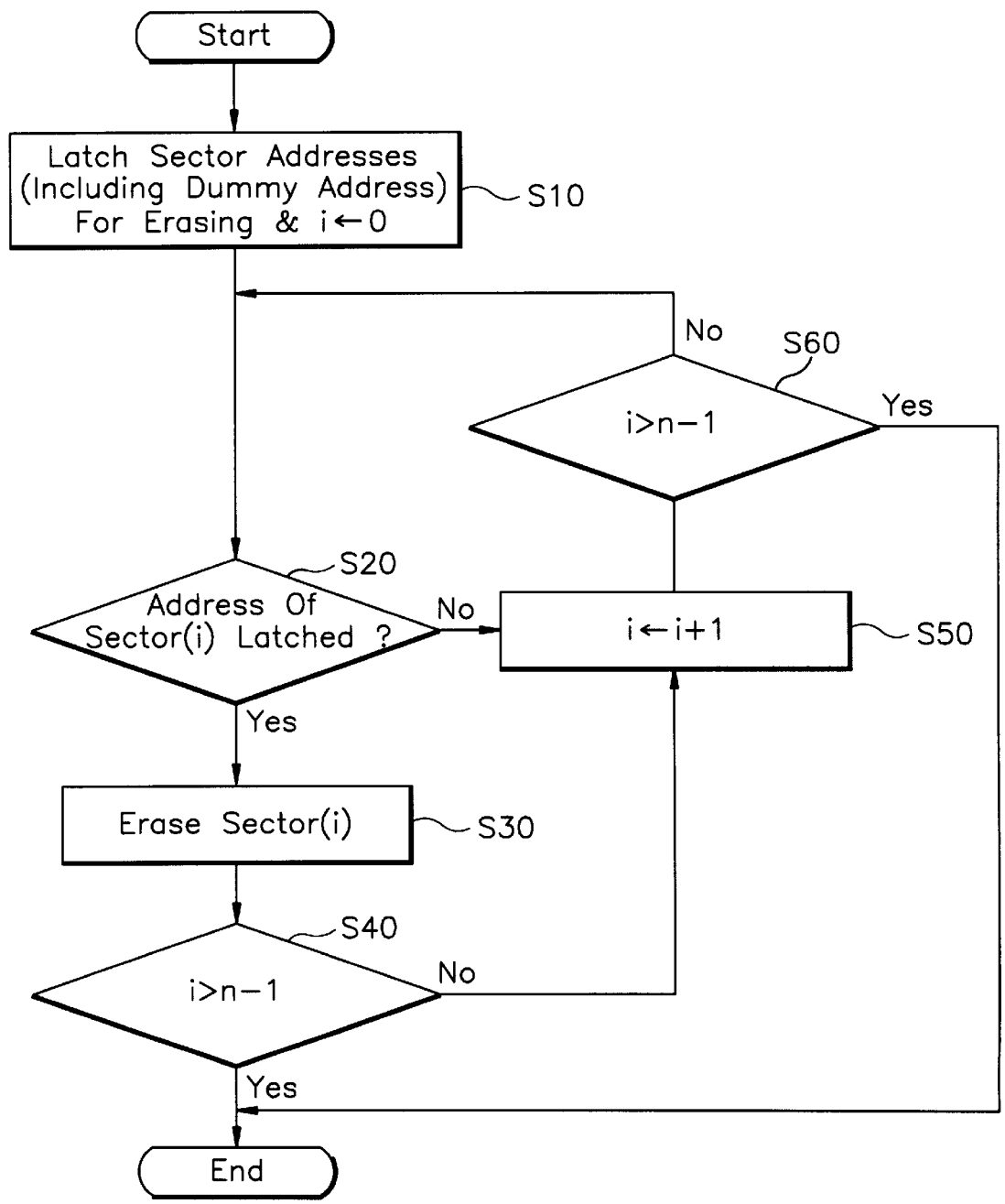
FIG. 2 is a chart showing a sequence of an erase operation in a nonvolatile memory device, according to the invention.

Hereinbelow, applicable embodiments of the invention will be as follows, with the appended drawings.

FIG. 1 shows a sequential step of coding addresses for selecting memory sectors to be erased. First, a dummy address signal and address signals are loaded into the memory and latched therein at step S10. And next, step S20 starts to check, from the first sector SA0, whether the address corresponding to the sector to be erased has been latched in a flip-flop. If there has not been latched of the corresponding address, the next operation goes to step S50 in which an order of the sector to be checked is increased therefrom, e.g., from I to I+1 (I denotes a current sector number; 0~n−1), and then repeatedly conducts the step S20. On the other hand, if the address corresponding to the current sector has been latched, step S30 is activated to perform an erase operation for the current sector. After completing the erase operation for one sector, step S40 determines whether the current sector is the latest sector (n−1'th sector when the number of the sectors is n) or not. The erase cycle is not finished until the current sector number becomes n. Namely, all of the erase operation is over if i>n−1 and, if not, the step S50 is connected therefrom.

Now, an explanation about the present address coding configuration in the erase operation will be given in conjunction with the table chart of FIG. 3. Assuming that the number of the sectors is nineteen, address signals A18~A15, of four bits, are counted up to 1111 from 0000 so as to generate four-bit codes for selecting sixteen sectors SA0~SA15. While this, dummy address signal DA19 is held on 0". From sector SA16, the counting-up process is recycled from 0000 and the dummy address signal DA19 changing to "1" acts as the most significant bit, i.e., 10000. Thus, SA17 and SA18 have their own coded addresses such as 10001 and 10010, respectively. The dummy address signal DA19 is used only in the erase operation, not in a programming operation in which the additional address signals A14, A13 and A12 are assigned. During the erase operation, the A14, A13 and A12 are regarded to be not cared therein because the addition of the dummy address signal DA19 makes it possible to generate thirty-two coded combinations of address signals capable of selecting thirty-two sectors.

As described above, the one bit of the dummy address signal makes the additional sectors to be erased be available to have their own addresses without further address bits and logic components for the address coding, simplifying the logic system for the address coding on the erase function.

Although embodiment of the invention have been disclosed and described, it will be appreciable that other embodiments and modification of the invention are possible.

What is claimed is:

1. A method for erasing data stored in a memory halving a plurality of memory sectors, the method comprising the steps of:

loading at least a dummy address bit and a plurality of address bits;

checking whether an address corresponding to a first sector has been latched, and recycling the checking operation against a second sector when the address of the first sector is not latched; and performing an erase operation for a sector assigned to an address latched therein until the erase operation is done for a last sector.

2. A method of claim 1, wherein the address includes the dummy address bit and the address bits.

3. A method for erasing data stored in a memory receiving address signals of n bits and having a plurality of sectors the number of which is larger than $2^n$, the method comprising:

loading at least a dummy address bit and address bits of the n bits, the dummy address bit and the address bits forming an address for selecting the sector;

checking whether an address corresponding to a first sector has been latched, and recycling the checking operation against a second sector when the address of the first sector is not latched; and performing an erase operation for a sector assigned to an address latched therein until the erase operation is done for a last sector.

* * * * *